Figure 1:
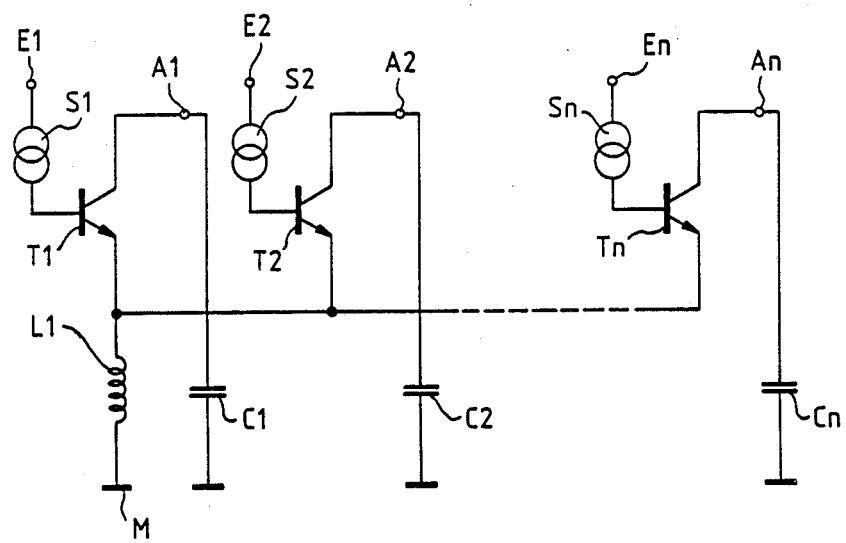

United States Patent [19]

Elmer et al.

[11] Patent Number: 4,920,283
[45] Date of Patent: Apr. 24, 1990

[54] HIGH SPEED, LOW NOISE INTEGRATED CIRCUIT

[75] Inventors: Werner Elmer, Moosburg; Michael Schmitt, Freising, both of Fed. Rep. of Germany

[73] Assignee: Texas Instruments Incorporated, Dallas, Tex.

[21] Appl. No.: 272,157

[22] Filed: Nov. 16, 1988

[51] Int. Cl.$^5$ .................. H03K 17/16; H03K 19/003
[52] U.S. Cl. .................. 307/443; 307/270; 307/546; 307/454; 307/296.4
[58] Field of Search ............ 307/443, 454, 546, 562, 307/296.4, 552, 270, 475

[56] References Cited

U.S. PATENT DOCUMENTS

| | | | |
|---|---|---|---|
| 3,999,080 | 12/1976 | Weathersby, Jr. et al. | 307/456 |
| 4,697,111 | 9/1987 | Van Zanten et al. | 307/443 |
| 4,764,688 | 8/1988 | Matsumura | 307/270 |
| 4,777,389 | 10/1988 | Wu et al. | 307/443 |
| 4,783,601 | 11/1988 | Hartgring et al. | 307/270 |
| 4,825,099 | 4/1989 | Barton | 307/270 |

Primary Examiner—Stanley D. Miller
Assistant Examiner—Richard Roseen
Attorney, Agent, or Firm—William E. Hiller; N. Rhys Merrett; Mel Sharp

[57] ABSTRACT

An integrated circuit is described which includes a plurality of output transistors (T1, T2, ... Tn) for emitting binary signals to associated output terminals (A1, A2, ... An). The integrated circuit further includes at least one ground terminal (M; M1, M2 ... Mn). Between the base of each transistor (T1, T2, ... Tn) and the at least one ground terminal (M; M1, M2, ... Mn) a current source (R1, D1) controlled by the base voltage is inserted.

3 Claims, 2 Drawing Sheets

HIGH SPEED, LOW NOISE INTEGRATED CIRCUIT

The invention relates to an integrated circuit comprising a plurality of output transistors for emitting binary signals to associated output terminals and having at least one ground terminal. Integrated circuits of this type are today used to a very great extent for a great variety of purposes. In particular, computer technology would be inconceivable without the development of modern integrated circuits. It is precisely for the field of computer technology that integrated circuits have been developed in CMOS technology or in bipolar technology with the aid of which switching operations can be carried out with ever increasing speeds. Switching times, i.e. transition times, in which a signal at one circuit output changes from one binary value to the other, have been achieved which are of the order of magnitude of nanoseconds or therebelow, permitting correspondingly highspeed computers. However, in the development of such integrated circuits permitting very short switching times limits have been reached which are due not to the technology used in the implementation of the electronic circuit in the semiconductor chip but to the package or case forms usual at present. The conductor strips via which the connection between the electrical circuit on the semiconductor chip and the external circuits is established have a certain geometrical length so that they behave at high frequencies like an inductance opposing a high switching speed. The presence of the line inductance of the conductor strips, which is not negligible, has a serious disadvantage which makes it almost impossible to utilize the high switching speeds which with semiconductor technology could already be achieved with the electronic circuit in a semiconductor chip. On a rapid current change in the conductor strip serving to supply the ground potential a voltage is induced in said conductor strip which momentarily increases the ground potential at the semiconductor chip. This can happen to such an extent that the switching threshold of the circuit is exceeded so that at a conductor strip connected to an output the transition from one significant signal level (the L level) to the other significant signal level (the H level) is simulated without however any change in the input signal having taken place. This puts limits on the use of increasingly higher switching speeds.

This problem of the increase in the ground potential at high switching speeds has led to integrated circuits which have up to four ground terminals with the objective of fixing the electronic circuit on the semiconductor chip more firmly to the ground potential. One example of such a solution is found in the brochure published in 1986 of the company Texas Instruments under the title "Enhanced Performance implanted CMOS (EPIC) Advanced CMOS Logic (ACL)" by Martha M. Weinstein et al. Admittedly, this solution already provides a certain improvement, i.e. permits better utilization of the possible high switching speeds without increasing the ground potential too much; however, full utilization of the possible high switching speeds is still not possible with this solution due to the line inductances still present.

The invention is based on the problem of providing an integrated circuit of the type outlined at the beginning with which the high switching speeds made possible by semiconductor technology of the electronic circuits contained on the semiconductor chip can be utilized to a substantially better extent.

According to the invention this problem is solved in that between the base of each output transistor and the at least one ground terminal a current source controlled by the base voltage is inserted.

If in the integrated circuit according to the invention the binary value of the output signal of an output transistor is to be changed the base potential of said output transistor is changed. This base voltage change influences the current source connected to the base in such a manner that part of the base current is branched off so that as a result the output voltage in the output transistor is also reduced for the duration of the base voltage change. The reduction of the current change per unit time results in a reduction of the voltage induced in the supply line inductance between the ground terminal of the output transistor and the transistor itself so that the undesired increase in the ground potential is considerably diminished. The effect achieved by the base-voltage-dependent current source is that of a negative feedback which during the voltage change counteracts too rapid a current increase in the output circuit of the output transistor.

Advantageous further developments of the invention are characterized in the subsidiary claims. By the separation of the ground terminals the further development according to claim 2 provides a further reduction in the increase of the ground potential on switching through one or more output transistors. The further development characterized in claim 3 provides at the base of each output transistor a current source responding overproportionally to base voltage changes so that the desired effect of the circuit according to the invention is achieved to an even greater extent.

Figure 2:
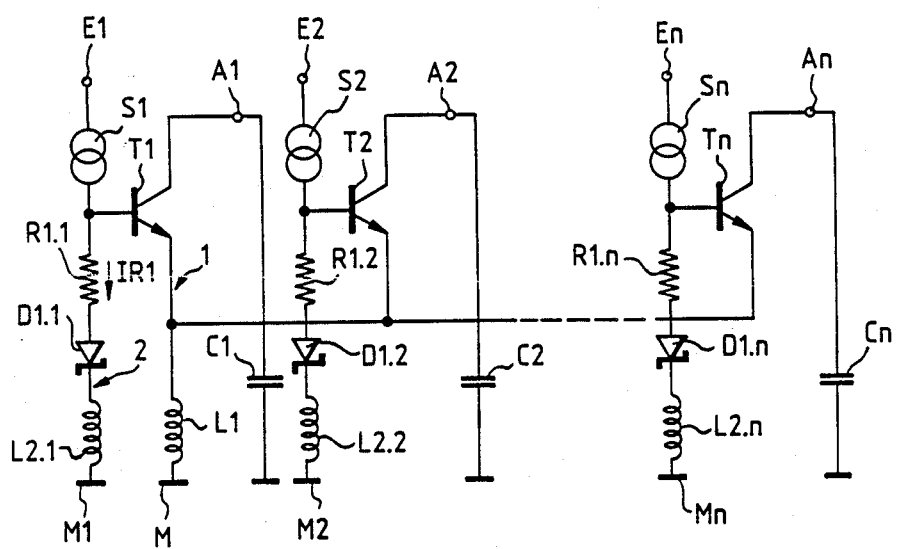

The invention will now be explained by way of example with the aid of the drawings, wherein:

FIG. 1 is a schematic illustration of parts of an intergrated circuit according to the prior art, FIG. 2 is a similar schematic illustration of an integrated circuit according to the invention and FIGS. 3a to 3d are diagrams showing the profile of signals at various points of the circuit of FIG. 2.

The circuit arrangement illustrated in FIG. 1 represents in very schematic form an integrated circuit including a plurality of output transistors T1, T2, ... Tn. The parts of the circuit with which the individual output transistors are respectively driven are represented symbolically as current sources S1, S2, ... Sn. The circuit comprises input terminals E1, E2, ... En and output terminals A1, A2, ... An. Furthermore, the circuit has a ground terminal M; a likewise present supply voltage terminal is not shown in the schematic circuit diagram of FIG. 1 because it is of no significance to the following explanation.

As load at each output terminal A1, A2, ... An a respective capacitor C1, C2, ... Cn is shown. The inductance L1 lying between the connected emitters of the transistors T1, T2, ... Tn and the ground terminal M is the line inductance between the external ground terminal M and the emitter contact points on the semiconductor chip in the integrated circuit.

Circuits of this type are used to generate at the outputs signals of the one or other binary value, i.e. signals having either the H level or the L level, the L level being at ground potential. The line inductance L1 leads to problems in such circuits because when a varying current flows therethrough it induces a voltage which results in an increase in the ground potential. This increase in the ground potential also however shifts the L level and this may happen to such an extent that the switching threshold between the L level and H level is exceeded. If for example it is assumed that the inductance value of the line inductance L1 is 15 nH and a current change of 200 mA takes place in 2.5 ns the line inductance L1 will induce the following voltage U:

$$U = L \frac{\Delta i}{\Delta t} = 15\,n \frac{Vs}{A} \cdot \frac{200\,mA}{2.5\,ns} = 1{,}2\,V$$

This voltage value of 1.2 V lies directly in the region of the switching threshold, i.e. of the transition region between the L level and the H level.

It must be remembered that the current flowing through the line inductance L1 is directly proportional to the number of output transistors which at the particular instant considered happen to be changing their switch state. The problem outlined is particularly serious when a transition of the signal state takes place at an output from the H level to the L level because in this case the capacitor acting as load discharges very rapidly, i.e. within about 2 to 3 ns. This leads to a very "hard" switching through of the transistors and a correspondingly high induced voltage in the line inductance L1.

In the circuit arrangement of FIG. 2 steps are taken to weaken this "hard" switching through or rendering conductive of the output transistors so that the voltage induced in the line inductance L1 is substantially smaller. To obtain this effect in the circuit arrangement of FIG. 2 in each case between the base of an output transistor T1, T2, . . . Tn a series circuit comprising a resistor R1 and a diode D1 is connected which is connected for direct current to ground. The inductance L2 between the diode D1 and ground represents the line inductance between the anode contact point of the diode D1 on the semiconductor chip and the external ground terminal M1. As will be shown below, the series circuits each comprising a resistor and a diode and connected to the respective base terminals of the transistors T1, T2, . . . Tn behave like a voltage source whose current depends on the base voltage.

FIG. 2 illustrates the case in which the integrated circuit apart from the ground terminal M has at least one further ground connection to which the ground terminals M1, M2, . . . Mn are connected.

It should be remembered in the following remarks that the current change produced on switching through an output transistor T1, T2, . . . Tn in the line inductance L1 is several orders of magnitude greater than the current change which takes place in the line inductance L2 on such a switching operation because the collector current of the transistor flows through the line inductance L1 whilst only a part of the base current can flow through the line inductance L2. In the conductive state the following current through an output transistor flows through the series circuit of a resistor R1 and a diode D1:

$$I_{R1/D1} = \frac{U_{BET1} - U_{SD1}}{R1} = 0.4\,mA$$

Wherein:

$U_{BET1} = 0.75$ V (base-emitter voltage of the transistor T1)

$U_{SD1} = 0.55$ V (forward voltage of the diode D1)

$R1 = 500\,\Omega$ (resistance of R1)

This current of 0.4 mA is a fraction of the base current of the output transistor which is switching at that instant.

If the respective output transistor is dynamically switched the emitter and base voltages of the transistor increase by the voltage drop at the line inductance L1. The voltage at the line inductance L2 remains in contrast negligibly small. As a result the voltage drop at the resistor R1 becomes greater and this means that a greater part of the base current of the particular switching transistor T1, T2, . . . Tn is branched off to ground. The transistor concerned is therefore switched through more slowly and the voltage drop at the line inductance L1 is reduced. The following equation applies:

$$I_{R1/D1dyn.} = \frac{U_{BET1} - U_{SD1} + U_{L1} - U_{L2}}{R1}$$

With:

$U_{BET1} = 0.75$ V (base-emitter voltage of the transistor T1)

$U_{SD1} = 0.55$ V (forward voltage of the diode D1)

$R1 = 500\,\Omega$ (resistance of R1)

$U_{L1} = 0.7$ V (voltage across L1)

$U_{L2} = 0.1$ V (voltage across L2)

on applying the above equation the resulting current through the series circuit of the resistor R1 and the diode D1 is 1.6 mA. This shows that the current flowing through the series circuit of the resistor R1 and the diode D1 is taken from the base current of the particular output transistor which is switching and as a result the current flowing through the line inductance L1 is also reduced during the switching operation. Accordingly, a lower voltage is induced in the line inductance L1 so that the undesired pronounced increase in the ground potential does not occur. It was possible to show with practical experiments that the ground potential was not raised above 0.7 V.

By using the diode in the connection between the base of said output transistor and ground the current diverted to ground from the base current does not increase proportionally to the base voltage, as would be the case if only a resistor were inserted between base and ground, but increases overproportionally. This can be illustrated by the following example:

If current flows through the diode D1 a constant forward voltage of 0.55 V is always applied thereto. On a rise of the voltage at the base of the transistor T1 the voltage across the resistor thus increases from 0.20 V to 0.40 V, that is the voltage across the resistor R1 is doubled. As a result the current flowing from base to ground is also twice as great although the voltage at the base was only increased by 26%. This is also the reason why the series circuit of the resistor R1 and the diode D1 at the base of each output transistor T1, T2, . . . Tn can be regarded as a current source which is controlled by the base voltage and conducts a current depending on said base voltage to ground.

As already mentioned, in the circuit arrangement of FIG. 2 the series circuits each comprising a resistor R1 and a diode d1 at the base of each output transistor T1, T2, . . . Tn are connected to an own ground terminal M1, M2, . . . Mn, all said ground terminals being connected together and via an own conductor led out of the package of the integrated circuit. However, with integrated circuits having only a single ground terminal it is also possible to use the series circuit of a resistor R1 and a diode D1 for conducting away base current with the objective of preventing the rise of the ground potential when the associated output transistor is switched through. In this case the anodes of all the diodes D1 are connected to the line connecting all the emitters of the output transistors T1, T2, ... Tn. The base current is then conducted via the respective series circuit of the resistor R1 and diode D1 to this connecting line which is connected via the line inductance L1 to the ground terminal M.

Figure 3A:
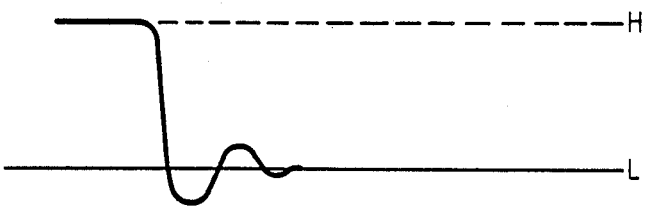
Figure 3B:
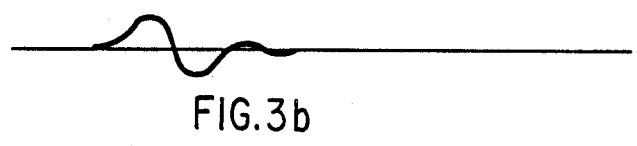
Figure 3C:
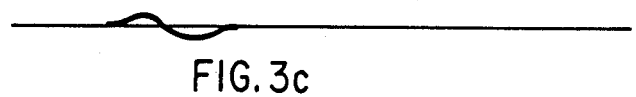
Figure 3D:
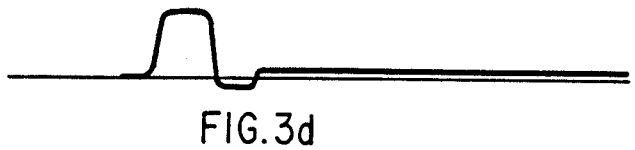

FIGS. 3a–3d show diagrams explaining the behaviour of the circuit arrangement illustrated in FIG. 2. FIG. 3a shows the voltage at the circuit output A1 on transition of the output signal from the high signal value to the low signal value, i.e. from H level to L level. FIG. 3b shows the ground potential at the circuit point 1 which is identical to the internal ground point to which all the emitters of the output transistors T1, T2, ... Tn are connected. It is apparent from the diagram of FIG. 3b that at the instant of the transition of the output signal, i.e. when the respective output transistor is switched through, a rise of the ground potential at the circuit point 1 occurs. Because of the use of the series circuits each comprising a resistor R1 and a diode D1 at the base of each output transistor this rise of the ground potential remains however so small that there are no disadvantageous effects, in particular the ground potential cannot increase to such an extent that it comes close to the level defined as threshold of the transition between the L level and the H level. In practice the rise of the ground potential remains below 0.7 V. FIG. 3c shows the rise of the ground potential at the circuit point 2 caused by the line inductance L2.1, said rise remaining however very small because the current flowing through the line inductance L2.1 also has a very small value. FIG. 3d shows the profile of the current IR1 flowing through the resistor R1.1.

We claim:

1. Integrated circuit comprising a plurality of output transistors for emitting binary signals to associated output terminals and having at least one ground terminal, characterized in that between a base of each output transistor and the at least one ground terminal a current source controlled by a base voltage is inserted.

2. Integrated circuit according to claim 1, characterized in that a plurality of separate ground terminals is provided, that emitters of the output transistors are connected to one of the ground terminals and the current sources are connected to one of the other ground terminals.

3. Integrated circuit according to claim 1, characterized in that the current source is formed by a series circuit of a low-resistance resistor and a diode conducting current in the direction towards the at least one ground terminal.

* * * * *